(12) United States Patent
Choi et al.

(10) Patent No.: US 12,075,648 B2
(45) Date of Patent: Aug. 27, 2024

(54) DISPLAY PANEL AND DISPLAY APPARATUS INCLUDING THE SAME

(71) Applicant: Samsung Display Co., Ltd., Yongin-si (KR)

(72) Inventors: Sungmin Choi, Yongin-si (KR); Minho Um, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 265 days.

(21) Appl. No.: 17/548,565

(22) Filed: Dec. 12, 2021

(65) Prior Publication Data
US 2022/0310970 A1    Sep. 29, 2022

(30) Foreign Application Priority Data

Mar. 29, 2021  (KR) .................. 10-2021-0040502

(51) Int. Cl.
*H10K 50/844*  (2023.01)
*G06F 3/044*   (2006.01)
*H10K 50/80*   (2023.01)
*H10K 59/131*  (2023.01)
*H10K 59/40*   (2023.01)
*H10K 102/00*  (2023.01)

(52) U.S. Cl.
CPC ......... *H10K 50/844* (2023.02); *G06F 3/0446* (2019.05); *H10K 50/868* (2023.02); *H10K 59/131* (2023.02); *H10K 59/40* (2023.02); *H10K 2102/311* (2023.02)

(58) Field of Classification Search
CPC .. H10K 50/844; H10K 50/868; H10K 59/131; H10K 59/40; H10K 2102/311; H10K 59/12; H10K 50/84; H10K 50/85; G06F 3/0446; G06F 3/04164
See application file for complete search history.

(56) References Cited

U.S. PATENT DOCUMENTS

| 10,818,873 | B2 | 10/2020 | Kwon et al. |
| 2018/0097199 | A1* | 4/2018 | Jo .......................... H10K 71/00 |
| 2018/0158893 | A1* | 6/2018 | Tokuda ............. G02F 1/133308 |

(Continued)

FOREIGN PATENT DOCUMENTS

| KR | 10-0562533 | 3/2006 |
| KR | 10-2019-0134294 | 12/2019 |

(Continued)

*Primary Examiner* — Kyoung Lee
(74) *Attorney, Agent, or Firm* — CANTOR COLBURN LLP

(57) ABSTRACT

A display panel and a display apparatus including the same, which reduce the magnitude of internal stress in a bending area and an area adjacent to the bending area in the display panel and minimizing or preventing occurrence of cracks and damage. The display panel includes: a substrate including a first area, a second area located at one side of the first area, and a third area between the first area and the second area; a display layer arranged in the first area on a first surface of the substrate, the display layer including a light-emitting element; a functional layer on the display layer; and a lower protective layer on a second surface opposite to the first surface of the substrate. A side surface of the functional layer coincides with a side surface of the lower protective layer.

18 Claims, 12 Drawing Sheets

(56) References Cited

U.S. PATENT DOCUMENTS

| | | |
|---|---|---|
| 2018/0248140 A1 | 8/2018 | Sano et al. |
| 2019/0259965 A1 | 8/2019 | Jeon et al. |
| 2020/0301541 A1 | 9/2020 | Jeon et al. |

FOREIGN PATENT DOCUMENTS

| | | |
|---|---|---|
| KR | 10-2020-0026231 | 3/2020 |
| KR | 10-2020-0041408 | 4/2020 |

* cited by examiner

DISPLAY PANEL AND DISPLAY APPARATUS INCLUDING THE SAME

CROSS-REFERENCE TO RELATED APPLICATION

This application claims priority from and the benefit of Korean Patent Application No. 10-2021-0040502, filed on Mar. 29, 2021, which is hereby incorporated by reference for all purposes as if fully set forth herein.dd

BACKGROUND

Field

Embodiments of the invention relate generally to a display panel and a display apparatus including the same, and more particularly, to a display panel with a bending area and a display apparatus including the display panel.

Discussion of the Background

Mobile electronic devices are widely used. As mobile electronic devices, not only small electronic devices, such as mobile phones but also tablet personal computers (PCs), have been widely used in recent years. Such mobile electronic devices include display apparatuses to provide various functions, for example, to provide visual information such as images or videos to users.

The display apparatus may include a display panel that implements an image and a display driver that controls driving of the display panel. The display driver may be electrically connected to the display panel by a chip-on-film (COF) method, a chip-on-glass (COG) method, a chip-on-plastic (COP) method, or the like. In the case of the COP method, at least a portion of a substrate of a display panel is bent so that a portion of the display panel overlaps another portion thereof. Therefore, a peripheral area of the display panel may be reduced in size.

However, in the case of a conventional display panel, cracks may occur in a bending area and an area adjacent to the bending area in the display panel, which results in damage to the display panel.

The above information disclosed in this Background section is only for understanding of the background of the inventive concepts, and, therefore, it may contain information that does not constitute prior art.

SUMMARY

One or more embodiments include a display panel and a display apparatus including the same, which are capable of reducing the magnitude of internal stress in a bending area and an area adjacent to the bending area in the display panel and minimizing or preventing occurrence of cracks and damage.

Additional features of the inventive concepts will be set forth in part in the description which follows and, in part, will be apparent from the description, or may be learned by practice of the inventive concepts.

An embodiment of the invention provides a display panel including a substrate including a first area, a second area located at one side of the first area, and a third area between the first area and the second area, a display layer arranged in the first area on a first surface of the substrate, the display layer including a light-emitting element, a functional layer on the display layer, and a lower protective layer on a second surface opposite to the first surface of the substrate. A side surface of the functional layer coincides with a side surface of the lower protective layer.

The display panel may further include a bending protective layer arranged in the third area of the substrate.

The bending protective layer may come in contact with the side surface of the functional layer.

The display panel may further include a lower cover panel on one surface of the lower protective layer.

The side surface of the functional layer may be located closer to the third area than the side surface of the lower cover panel.

The functional layer may include a polarizing film.

The functional layer may include an organic insulating film.

The display panel may further include an encapsulation layer between the display layer and the functional layer and covering the light-emitting element of the display layer.

The encapsulation layer may include at least one inorganic encapsulation layer and at least one organic encapsulation layer.

The display panel may further include a touch sensing layer between the encapsulation layer and the functional layer, the touch sensing layer including sensing electrodes and trace lines electrically connected to the sensing electrodes.

Another embodiment of the invention provides a display apparatus includes a display panel including a display area and a peripheral area surrounding the display area and including a bending area, at least a portion of which is bent, and a cover window on a front surface of the display panel. The display panel includes a substrate, a display layer on a first surface of the substrate, the display layer including a light-emitting element, a functional layer on the display layer, and a lower protective layer on a second surface opposite to the first surface of the substrate, wherein a side surface of the functional layer and a side surface of the lower protective layer are on a same straight line in a cross-sectional view.

The display panel may further include a bending protective layer on the first surface of the substrate and located in the bending area.

The bending protective layer of the display panel may come in contact with the side surface of the functional layer.

The display panel may further include a lower cover panel under the lower protective layer.

The side surface of the functional layer of the display panel may be located closer to the bending area than a side surface of the lower cover panel.

The functional layer of the display panel may include a polarizing film.

The functional layer of the display panel may include an organic insulating film.

The display panel may further include an encapsulation layer between the display layer and the functional layer in the display area.

According to the inventive concepts, the encapsulation layer of the display panel may include a first inorganic encapsulation layer, a second inorganic encapsulation layer on the first inorganic encapsulation layer, and an organic encapsulation layer between the first inorganic encapsulation layer and the second inorganic encapsulation layer.

According to the inventive concepts, the display panel may further include a touch sensing layer between the encapsulation layer and the functional layer, the touch sensing layer including sensing electrodes and trace lines electrically connected to the sensing electrodes.

These general and specific aspects may be implemented by using a system, a method, a computer program, or any combination thereof.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
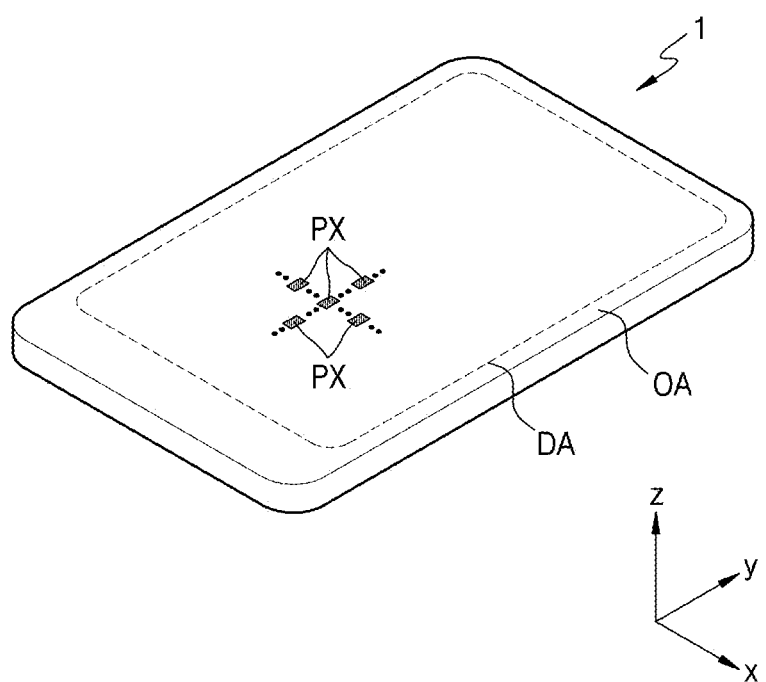
FIG. 1 is a perspective view schematically illustrating a display apparatus according to an embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view schematically illustrating a display apparatus 1 according to an embodiment.

Referring to FIG. 1, the display apparatus 1 may include a display area DA and an outer area OA outside the display area DA. The display apparatus 1 may provide an image through an array of a plurality of pixels PX that are two-dimensionally arranged in the display area DA in rows and columns. The pixel PX may be defined as an emission area in which a light-emitting element driven by a pixel circuit emits light. That is, an image may be provided by light that is emitted by the light-emitting element through the pixel PX. Because an area in which an image is provided is determined by the arrangement of the light-emitting elements, the display area DA may be defined by the light-emitting elements. Not only light-emitting elements and pixel circuits but also various signal lines and power lines electrically connected to the pixel circuits may be arranged in the display area DA.

The outer area OA is an area that does not provide an image, and may completely or partially surround the display area DA. Various lines, driving circuits, and the like configured to provide electric signals or power to the display area DA may be arranged in the outer area OA.

The display apparatus 1 may have a substantially rectangular shape when viewed from a direction perpendicular to one surface thereof. For example, as illustrated in FIG. 1, the display apparatus 1 may have a substantially rectangular planar shape having a short side extending in a first direction (e.g., x direction) and a long side extending in a second direction (e.g., y direction). A corner in which the short side in the first direction and the long side in the second direction meet each other may have a right-angled shape, or may have a round shape with a certain curvature, as illustrated in FIG. 1. Of course, the planar shape of the display apparatus 1 is not limited to the rectangular shape, and may have various shapes including a polygonal shape, such as a triangular shape, a circular shape, an elliptical shape, and an irregular shape.

A case in which the display apparatus 1 includes an organic light-emitting diode (OLED) as the light-emitting element will be described below, but the display apparatus 1 according to the inventive concepts is not limited thereto. According to another embodiment, the display apparatus 1 may be a light-emitting display apparatus including an inorganic light-emitting diode, that is, an inorganic light-emitting display apparatus. According to another embodiment, the display apparatus 1 may be a quantum dot light-emitting display apparatus.

On the other hand, the display apparatus 1 may be used as a display screen for various products such as not only portable electronic devices, such as mobile phones, smart phones, tablet personal computers (PCs), mobile communication terminals, electronic organizers, e-books, portable multimedia players (PMPs), navigations, and ultra mobile PCs (UMPCs), but also televisions (TVs), laptops, monitors, billboards, and internet of things (IoT) devices. The display apparatus 1 may also be used in wearable devices, such as smart watches, watch phones, glasses-type displays, or head mounted displays (HMDs). The display apparatus 1 may also be used in dashboards of automobiles, center information displays (CIDs) of the center fascia or dashboards of automobiles, room mirror displays that replace the side mirrors of automobiles, and display screens arranged on the rear sides of front seats to serve as entertainment devices for backseat passengers of automobiles. Hereinafter, for convenience of description, a case in which the display apparatus 1 is used in a smart phone will be described.

Figure 2:
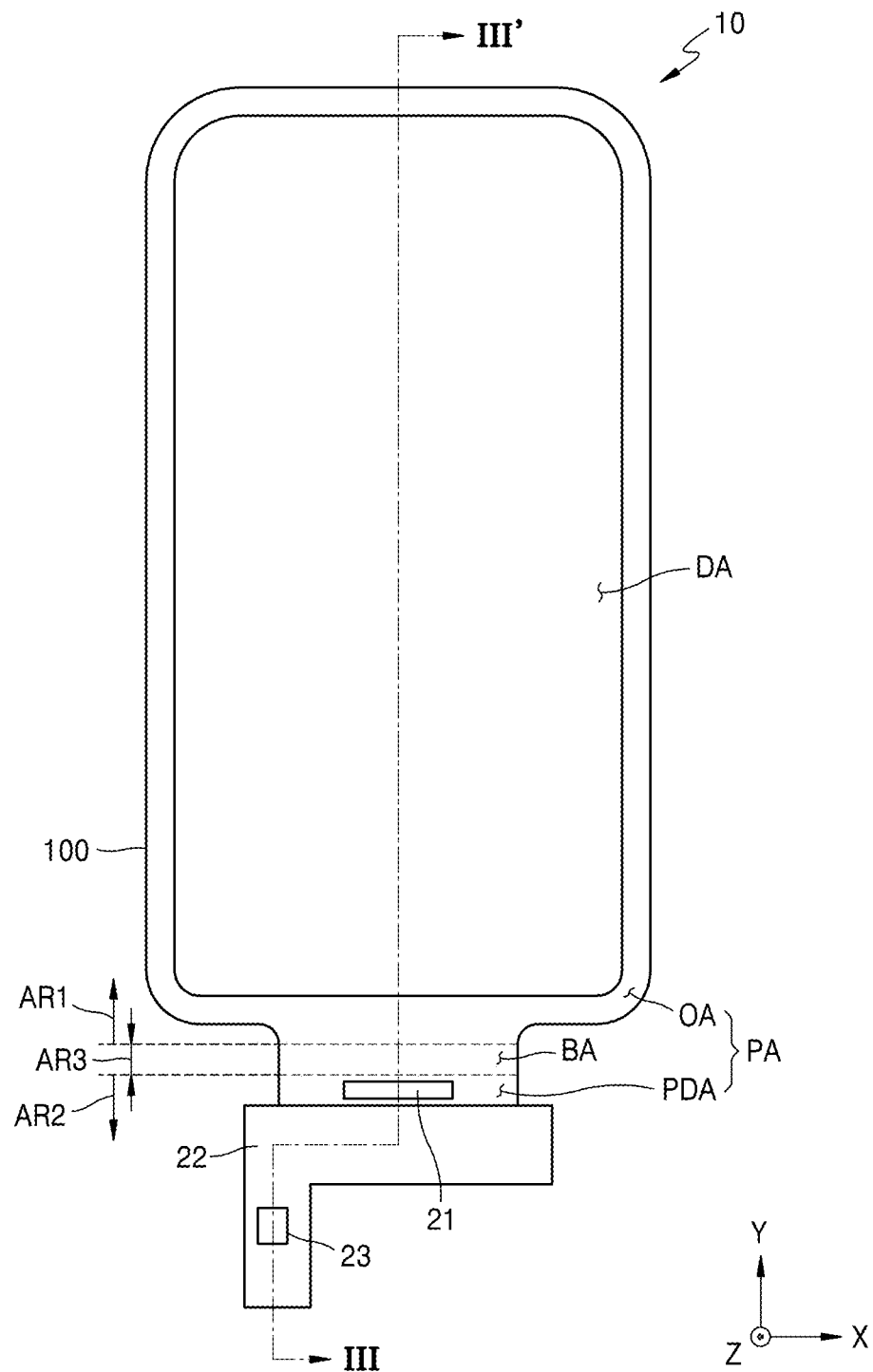
FIG. 2 is a plan view schematically illustrating a portion of a display panel included in a display apparatus, according to an embodiment.

FIG. 2 is a plan view schematically illustrating a portion of a display panel included in a display apparatus, according to an embodiment.

Referring to FIG. 2, the display panel 10 may include a display area DA and a peripheral area PA surrounding at least a portion of the display area DA. The display area DA of the display panel 10 may correspond to the display area DA of the display apparatus 1 described above with reference to FIG. 1. Hereinafter, for convenience of description, a case in which the peripheral area PA completely surrounds the display area DA as illustrated in FIG. 2 will be described.

In an embodiment, the peripheral area PA may include an outer area OA outside the display area DA, a pad area PDA located at one side of the outer area OA, and a bending area BA between the outer area OA and the pad area PDA. The outer area OA may form the front surface of the display apparatus 1 together with the display area DA. The outer area OA of the display panel 10 may correspond to the outer area OA of the display apparatus 1 described above with reference to FIG. 1.

The bending area BA of the display panel 10 may be bent so that the pad area PDA overlaps the display area DA and/or the outer area OA on the rear surface of the display panel 10. Accordingly, the area of the peripheral area PA of the display apparatus 1, that is, a dead space, may be reduced.

A display driver 21 and a display circuit board 22 may be arranged in the pad area PDA. The display driver 21 may receive control signals and power supply voltages and may generate and output signals and voltages for driving the display panel 10. The display driver 21 may include an integrated circuit (IC).

The display circuit board 22 may be electrically connected to the display panel 10. For example, although not illustrated in FIG. 2, the display circuit board 22 may be electrically connected to a pad part (not illustrated) located in the pad area PDA through an anisotropic conductive film.

The display circuit board 22 may be a flexible printed circuit board (FPCB) that is bendable or a rigid printed circuit board (PCB) that is rigid and not easily bent. In some cases, the display circuit board 22 may be a composite printed circuit board including both the FPCB and the rigid PCB.

A sensor driver 23 may be on the display circuit board 22. The sensor driver 23 may include an IC. The sensor driver 23 may be attached or embedded on the display circuit board 22. The sensor driver 23 may be electrically connected to sensing electrodes of a touch sensing layer of the display panel 10 through the display circuit board 22.

In addition, a power supply (not illustrated) that supplies voltages for driving pixel circuits, a scan driver, and the display driver 21 of the display panel 10 may be additionally arranged on the display circuit board 22. In some embodiments, the power supply may be integrated with the display driver 21. In this case, the display driver 21 and the power supply may be implemented as a single IC.

Also, the display circuit board 22 may be electrically connected to a main circuit board (not illustrated). The main circuit board may include a main processor including a central processing unit (CPU), a graphics processing unit (GPU), a memory, a communication chip, a digital signal processor (DSP), an image signal processor (ISP), and various types of interfaces. For example, the man circuit board may include an application processor (AP).

On the other hand, the display panel 10 may include a substrate 100, and various components constituting the display panel 10 may be on the substrate 100. For example, a plurality of light-emitting elements defining the display area DA, pixel circuits configured to drive the light-emitting elements, signal lines and/or voltage lines configured to provide electric signals and/or voltages to the pixel circuits, driving circuits, and the like may be on the substrate 100. The display driver 21 and the display circuit board 22 described above may also be arranged on the substrate 100. In an embodiment, the display driver 21 and the display circuit board 22 may be located above the substrate 100. In another embodiment, when lines are arranged by drilling holes in the substrate 100, the display driver 21 and the display circuit board 22 may be located under the substrate 100.

The substrate 100 may include a first area AR1, a second area AR2 located at one side of the first area AR1, and a third area AR3 between the first area AR1 and the second area AR2. The first area AR1 of the substrate 100 may correspond to the display area DA and the outer area OA of the display panel 10, the second area AR2 may correspond to a portion of the pad area PDA, and the third area AR3 may correspond to the bending area BA.

On the other hand, the display panel 10 may include a flexible, foldable, or rollable display panel. For example, the display panel 10 may include a foldable display panel, a curved display panel in which at least a portion of a display surface is curved, a bended display panel in which areas other than a display surface are bent, a rollable display panel, or a stretchable display panel.

For example, the display panel 10 may include a transparent display panel. In this case, because the display panel 10 has transparent characteristics, a user is able to see an object or a background, which is arranged under the display panel 10, through the upper surface of the display panel 10. As another example, the display panel 10 may include a reflective display panel capable of reflecting an object or a background on the display panel 10.

Figure 3:
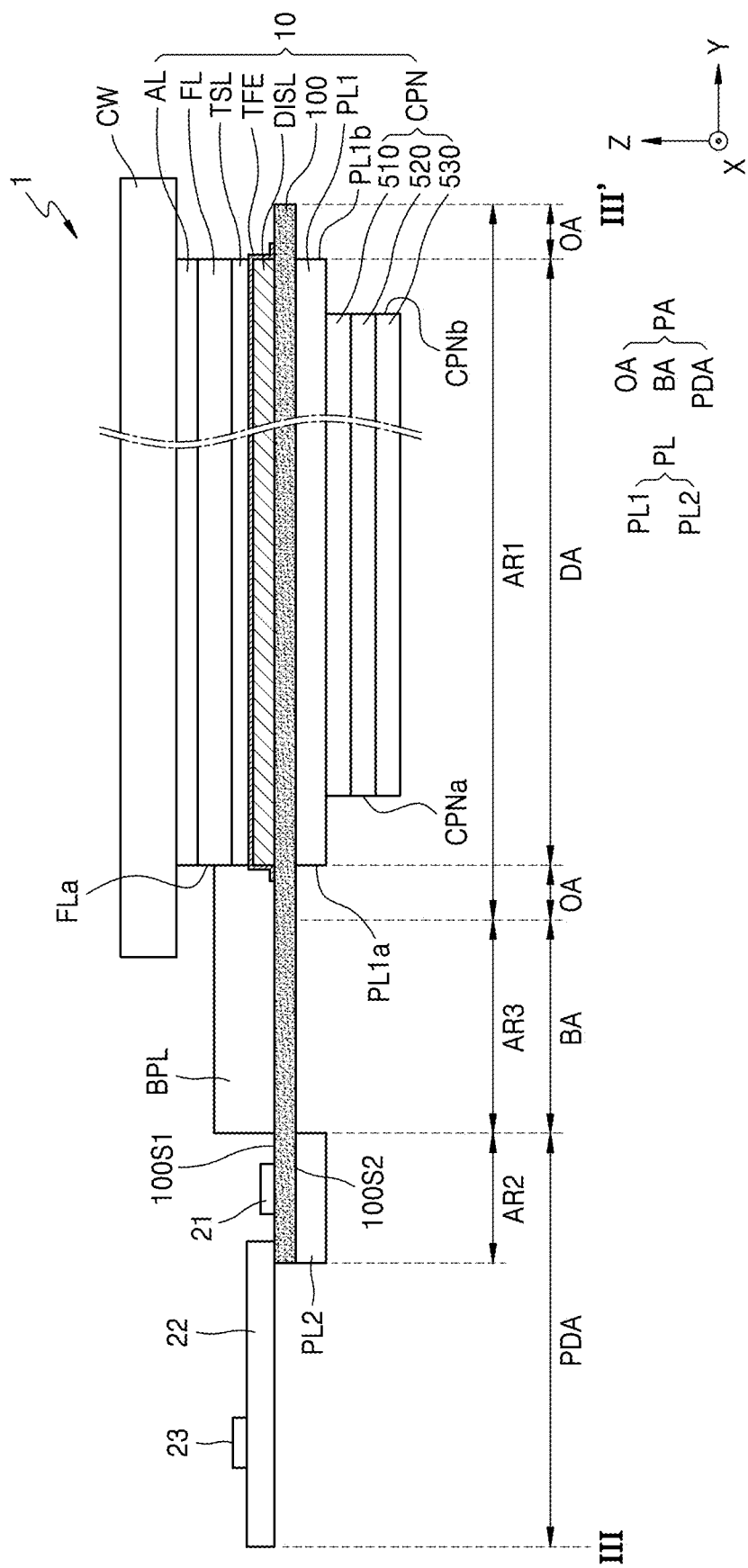
FIG. 3 is a cross-sectional view schematically illustrating a portion of a display apparatus, according to an embodiment.
Figure 4:
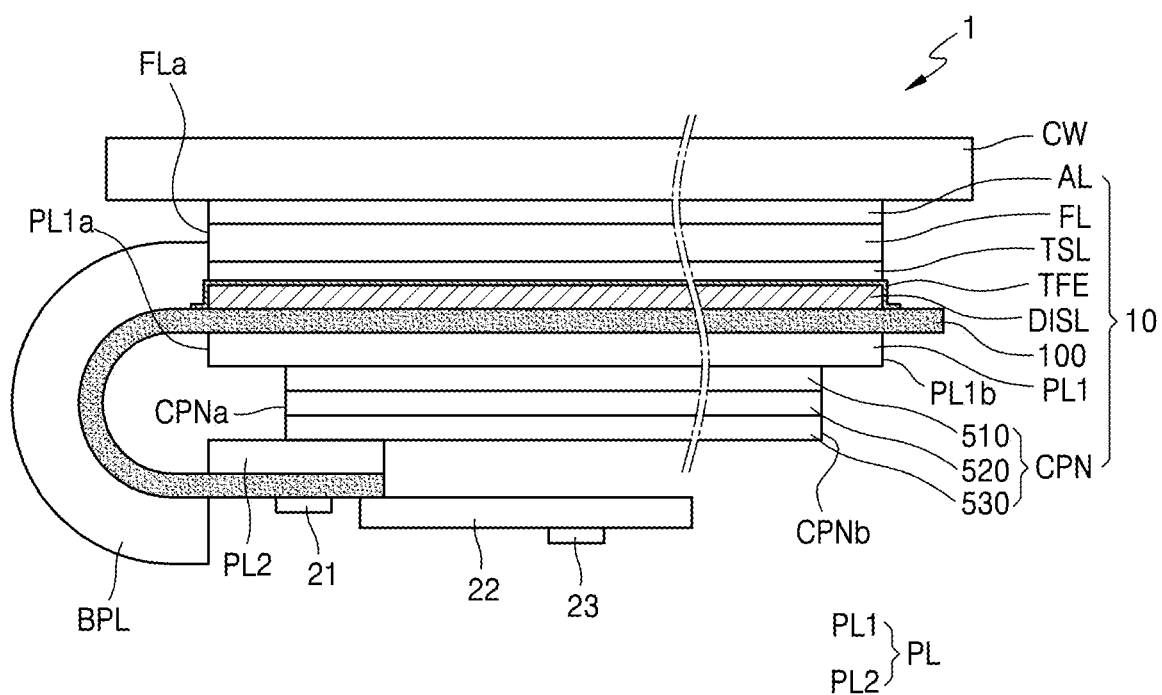
FIG. 4 is a cross-sectional view schematically illustrating a state in which a display panel of the display apparatus of FIG. 3 is bent.

FIG. 3 is a cross-sectional view schematically illustrating a portion of a display apparatus, according to an embodiment, and FIG. 4 is a cross-sectional view schematically illustrating a state in which a display panel of the display apparatus of FIG. 3 is bent. FIG. 3 corresponds to a cross-section taken along line III-III' of FIG. 2.

Referring to FIGS. 3 and 4, the display apparatus 1 may include a display panel 10 and a cover window CW arranged on the front surface of the display panel 10. The "front surface" may be defined as a surface through which a user is able to see an image provided by the display apparatus 1. Also, the display apparatus 1 may include the display driver 21, the display circuit board 22, and the sensor driver 23 described above. Of course, the display apparatus 1 may further include a bracket (not illustrated), a heat dissipation sheet (not illustrated), a battery (not illustrated), a camera module (not illustrated), a rear cover (not illustrated), and the like.

According to an embodiment, the cover window CW may be arranged to cover the front surface of the display panel 10. The cover window CW may protect the front surface of the display panel 10. The cover window CW may be attached to the display panel 10 by an adhesive layer AL. The adhesive layer AL may include, for example, an adhesive member, such as an optical clear adhesive (OCA) or a pressure sensitive adhesive (PSA).

The cover window CW may have a high transmittance so as to transmit light emitted from the display panel 10, and may have a small thickness so as to minimize the weight of the display apparatus 1. Also, in order to protect the display panel 10 from external impact, the cover window CW may have strong strength and hardness. For example, the cover window CW may include a flexible window. The cover window CW may protect the display panel 10 while being easily bent according to external force without generating cracks or the like. As another example, the cover window CW may include glass or plastic. For example, the cover window CW may include an ultra-thin glass (UTG), the strength of which is reinforced by chemical strengthening or thermal strengthening.

According to an embodiment, the display panel 10 may include a substrate 100, and a display layer DISL, an encapsulation layer TFE, a touch sensing layer TSL, and a functional layer FL, which are on a first surface 100S1 of the substrate 100. Also, the display panel 10 may include a lower protective layer PL and a lower cover panel CPN, which are arranged on a second surface 100S2 of the substrate 100. The first surface 100S1 of the substrate 100 may be defined as one surface of the substrate 100 facing the cover window CW, and the second surface 100S2 of the substrate 100 may be defined as a surface opposite the first surface 100S1. The first surface 100S1 of the substrate 100 may face the same direction as the front surface of the display panel 10 (e.g., +z direction), and the second surface 100S2 of the substrate 100 may face the same direction as the rear surface of the display panel 10 (e.g., −z direction).

On the other hand, the "upper surface" refers to a surface facing the cover window 100 with respect to the substrate 100, that is, a surface facing +z direction, and the "lower surface" refers to a surface opposite to the upper surface, that is, a surface facing −z direction. For example, the first surface 100S1 of the substrate 100 may also be referred to as the upper surface of the substrate 100, and the second surface 100S2 of the substrate 100 may also be referred to as the lower surface of the substrate 100.

In an embodiment, the substrate 100 may include a polymer resin. Therefore, the substrate 100 may include a flexible substrate that is bendable, foldable, or rollable.

The display layer DISL may be arranged in the first area AR1 on the first surface 100S1 of the substrate 100 and may include a plurality of light-emitting elements. That is, the display layer DISL may provide an image through light emitted from the light-emitting elements. The display layer DISL may further include pixel circuits and lines configured to drive the light-emitting elements. The display layer DISL has a stack structure including an inorganic layer, an organic layer, a metal layer, and the like. The display layer DISL will be described later in detail with reference to FIG. 5.

The encapsulation layer TFE may be on the display layer DISL. That is, the encapsulation layer TFE may be arranged between the display layer DISL and the functional layer FL. The encapsulation layer TFE may cover a portion of the first area AR1 of the substrate 100. In other words, the encapsulation layer TFE may cover the display area DA. For example, the encapsulation layer TFE may extend from the display area DA to the outer area OA, and an end portion of the encapsulation layer TFE may be located in the outer area OA. The encapsulation layer TFE may include at least one inorganic encapsulation layer and at least one organic encapsulation layer.

The touch sensing layer TSL may be arranged on the encapsulation layer TFE. That is, the touch sensing layer TSL may be arranged between the encapsulation layer TFE and the functional layer FL. The touch sensing layer TSL may be configured to sense a user touch input. Accordingly, the display panel 10 may function as an output device configured to provide an output interface between the display apparatus 1 and the user, may also function as an input device configured to provide an input interface between the display apparatus 1 and the user.

The functional layer FL may be located on the touch sensing layer TSL. In an embodiment, the functional layer FL may include an optical function layer configured to reduce the reflectance of light (external light) incident from the outside toward the display panel 10 and/or to improve color purity of light emitted from the display panel 10. In this case, the functional layer FL may be a polarizing film including a retarder and/or a polarizer. The retarder may include a λ/2 retarder and/or a λ/4 retarder.

In another embodiment, the functional layer FL may include a mechanical functional layer configured to reduce impact applied from the outside to the display panel 10 and/or to reduce the magnitude of maximum stress generated by the bending of the display panel 10. In this case, the functional layer FL may include an organic insulating film including an organic insulating material such as polyethylene terephthalate (PET) or polyimide (PI).

In another embodiment, the functional layer FL may include both the polarizing film and the organic insulating film described above.

The lower protective layer PL may be on the second surface 100S2 of the substrate 100. The lower protective layer PL may be attached to the second surface 100S2 of the substrate 100 through an adhesive member in the form of a film. Any adhesive member known in the art may be employed without limitation. For example, the adhesive member may include an OCA or a PSA. The lower protective layer PL may include a first lower protective layer PL1 located in the first area AR1 and a second lower protective layer PL2 located in the second area AR2. The first lower protective layer PL1 and the second lower protective layer PL2 may be located apart from each other with the third area AR3 arranged therebetween.

The lower protective layer PL may protect the substrate 100 from the outside. For example, the lower protective layer PL may absorb a physical impact from the outside, and the first lower protective layer PL1 and the second lower protective layer PL2 may prevent infiltration of foreign material or moisture into the display layer DISL and the display driver 21, respectively. In an embodiment, the lower protective layer PL may include an organic insulating material, such as polyethylene terephthalate (PET), polyimide (PI), or urethane acrylate.

In some embodiments, the lower protective layer PL may further include a material that blocks ultraviolet (UV) radiation. For example, the lower protective layer PL may include a base resin, a UV absorber, and inorganic particles. The UV absorber and the inorganic particles may be dispersed in the base resin. For example, the base resin may include an acrylate-based resin, for example, urethane acrylate. However, the inventive concepts are not limited thereto. Any base resin that is optically transparent and is capable of dispersing the UV absorber and the inorganic particles may be used for the lower protective layer PL without limitation. For example, the UV absorber may include at least one of benzotriazol, benzophenone, salicylic acid, salicylate, cyanoacrylate, cinnamate, oxanilide, polystyrene, azomethine, and triazine compounds. The lower cover panel CPN may be located on one surface of the lower protective layer PL. For example, the lower cover panel CPN may be located on the lower surface of the lower protective layer PL. In an embodiment, the lower cover panel CPN may include a light blocking layer 510, a cushion layer 520, and a heat dissipation layer 530. A double-sided adhesive may be arranged between any two components of the light blocking layer 510, the cushion layer 520, and the heat dissipation layer 530.

The light blocking layer 510 of the lower cover panel CPN may be arranged on the lower surface of the lower protective layer PL. The light blocking layer 510 may absorb external light. For example, the light blocking layer 510 may include a black pigment or a black dye to absorb external light. However, the inventive concepts are not limited thereto, and the light blocking layer 510 may include various materials capable of absorbing external light. The light blocking layer 510 may block light transmission to prevent components under the light blocking layer 510, for example, the display circuit board 22, from being viewed from the front of the display panel 10.

The cushion layer 520 may be arranged on the lower surface of the light blocking layer 510. The cushion layer 520 may absorb an external impact to prevent or minimize damage to the display panel 10. The cushion layer 520 may include an elastic material. For example, the cushion layer 520 may include a foam including a polymer resin such as polyurethane, polyethylene, polycarbonate, polypropylene, or polyolefin. Alternatively, the cushion layer 520 may include an elastic material such as a sponge formed by foam-molding a rubber, a urethane-based material, or an acrylic material. However, the material is only an example, and the cushion layer 520 may include a material having excellent compressive stress and excellent impact and vibration absorption.

The heat dissipation layer 530 may be arranged on the lower surface of the cushion layer 520. The heat dissipation layer 530 may efficiently dissipate heat generated from the display panel 10 to the outside. For example, the heat dissipation layer 530 may include a first heat dissipation layer including a metal thin-film, such as copper, nickel, ferrite, or silver that has excellent thermal conductivity and is capable of shielding electromagnetic waves, and a second heat dissipation layer including graphite or carbon nanotubes.

On the other hand, the relative positions of the light blocking layer 510, the cushion layer 520, and the heat dissipation layer 530 constituting the lower cover panel CPN may be variously modified.

According to an embodiment, the display layer DISL, the encapsulation layer TFE, the touch sensing layer TSL, and the functional layer FL on the first surface 100S1 of the substrate 100 may be located in the first area AR1 of the substrate 100. Also, the lower protective layer PL and the lower cover panel CPN on the second surface 100S2 of the substrate 100 may also be located in the first area AR1 of the substrate 100.

The display driver 21 may be arranged in the second area AR2 of the substrate 100. Also, the display circuit board 22 may be attached to the second area AR2 of the substrate 100.

As described above, because the substrate 100 is a flexible substrate, the substrate 100 may be bent in the third area AR3, as illustrated in FIG. 4. That is, the third area AR3 of the substrate 100 may form a bending area BA, and it may be understood that the display panel 10 is bent in the bending area BA. As the display panel 10 is bent, the pad area PDA of the display panel 10 may overlap the display area DA and/or the outer area OA of the display panel 10.

According to an embodiment, the display panel 10 may further include a bending protective layer BPL located in the third area AR3 of the substrate 100. The bending protective layer BPL may be on the first surface 100S1 of the substrate 100. That is, the bending protective layer BPL may be located in the bending area BA of the display panel 10. The bending protective layer BPL may be attached to the first surface 100S1 of the substrate 100 through an adhesive member. The bending protective layer BPL may include, for example, a polymer resin, such as polyethylene terephthalate (PET) or polyimide (PI).

The bending protective layer BPL may protect the bent substrate 100 from external impact and may support the bent substrate 100 so that the bent substrate 100 has a good shape when the substrate 100 is bent. Also, the bending protective layer BPL may reduce the maximum internal stress generated in the bending area BA of the display panel 10. The maximum internal stress may occur at a position farthest from a neutral plane in which the internal stress is zero (null). As a comparative example, when the bending protective layer BPL is not provided, the neutral plane may be located closer to the second surface 100S2 than the first surface 100S1 of the substrate 100. Therefore, the maximum internal stress (in this case, maximum tensile stress) may be formed on the first surface 100S1 of the substrate 100. However, according to an embodiment, because the display panel 10 includes the bending protective layer BPL on the first surface 100S1 of the substrate 100, the neutral plane may move toward the first surface 100S1 of the substrate 100, compared with the comparative example. Therefore, the magnitude of the maximum internal stress generated on the first surface 100S1 of the substrate 100 may be reduced. As a result, the probability that cracks or the like will be generated in the substrate 100 of the display panel 10 may be reduced.

According to an embodiment, a side surface FLa of the functional layer FL of the display panel 10 may coincide with a first side surface PL1a of the first lower protective layer PL1. That is, in a cross-sectional view, the side surface FLa of the functional layer FL and the first side surface PL1a of the first lower protective layer PL1 may lie on the same straight line. The term "in a cross-sectional view" may mean "on a plane including the y direction and the z direction of FIG. 3 as a virtual plane perpendicular to the first surface 100S1 of the substrate 100." The side surface FLa of the functional layer FL may be a side surface facing the bending area BA. Also, the first side surface PL1a of the first lower protective layer PL1 may be a side surface facing the bending area BA.

When a portion of the display panel 10 is bent around the bending area BA of the display panel 10, internal stress may be generated in the bending area BA and the outer area OA adjacent to the bending area BA. As the value of the maximum internal stress increases, there is a high probability that damage to the display panel 10, such as cracks, will be caused. However, according to an embodiment, because the side surface FLa of the functional layer FL of the display panel 10 and the first side surface PL1a of the first lower protective layer PL are arranged to coincide with each other, internal stress generated in the bending area BA and the outer area OA adjacent to the bending area BA of the display panel 10 may be reduced. This will be described with reference to FIGS. 5 and 6.

According to an embodiment, the bending protective layer BPL may come in contact with the side surface FLa of the functional layer FL. The bending protective layer BPL may extend from the bending area BA to the outer area OA adjacent to the bending area BA and may come in contact with at least a portion of the side surface FLa of the functional layer FL. Also, according to an embodiment, the side surface FLa of the functional layer FL may be located closer to the third area AR3 of the substrate 100 than a first side surface CPNa of the lower cover panel CPN. In other words, the side surface FLa of the functional layer FL may be located closer to the bending area BA than the first side surface CPNa of the lower cover panel CPN. The first side surface CPNa of the lower cover panel CPN may refer to a side surface facing the bending area BA. Therefore, the lower cover panel CPN may not overlap the bending protective layer BPL, and a good curved shape may be formed in the bending area BA of the display panel 10. As the display panel 10 is bent in a good shape, the magnitude of the maximum internal stress in the bending area BA may be reduced and the probability of occurrence of cracks may be reduced.

On the other hand, a second side surface PL1b of the first lower protective layer PL1 may be located on the opposite side to the first side surface PL1a of the first lower protective layer PL1. For example, the second side surface PL1b of the first lower protective layer PL1 may be located inside the edge of the substrate 100 and may coincide with the side surface of the display layer DISL. Of course, this is only an example, and the second side surface PL1b of the first lower protective layer PL1 may be located outside the side surface of the display layer DISL or may coincide with the edge of the substrate 100.

Also, a second side surface CPNb of the lower cover panel CPN may be located on the opposite side to the first side surface CPNa of the lower cover panel CPN. The second side surface CPNb of the lower cover panel CPN may be located inside the second side surface PL1b of the first lower protective layer PL1 and the side surface of the display layer DISL. Of course, this is only an example, and the second side surface CPNb of the lower cover panel CPN may coincide with the second side surface PL1b of the first lower protective layer PL1.

Figure 5:
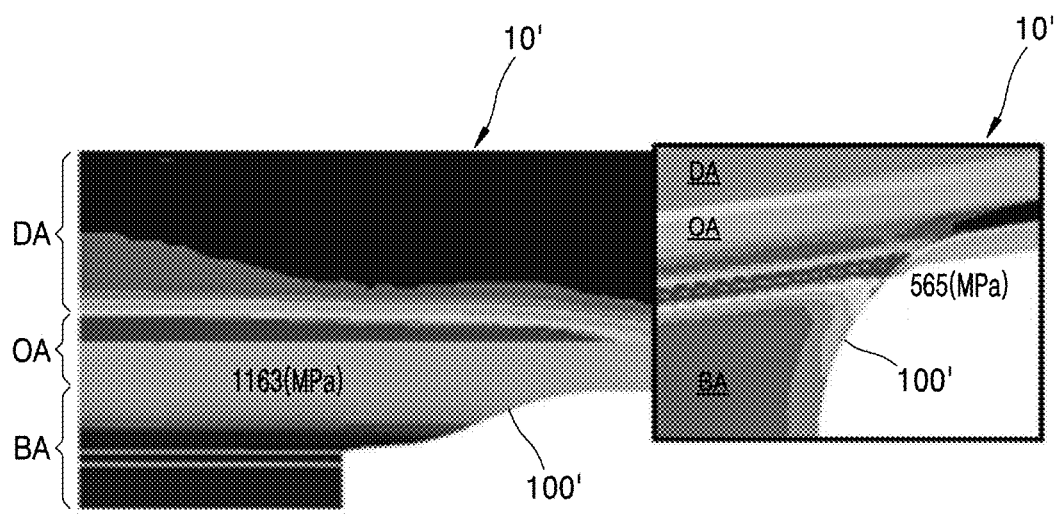
FIG. 5 is an image schematically illustrating distribution of internal stress generated in a bending area and an area adjacent to the bending area in a display panel according to a comparative example.
Figure 6:
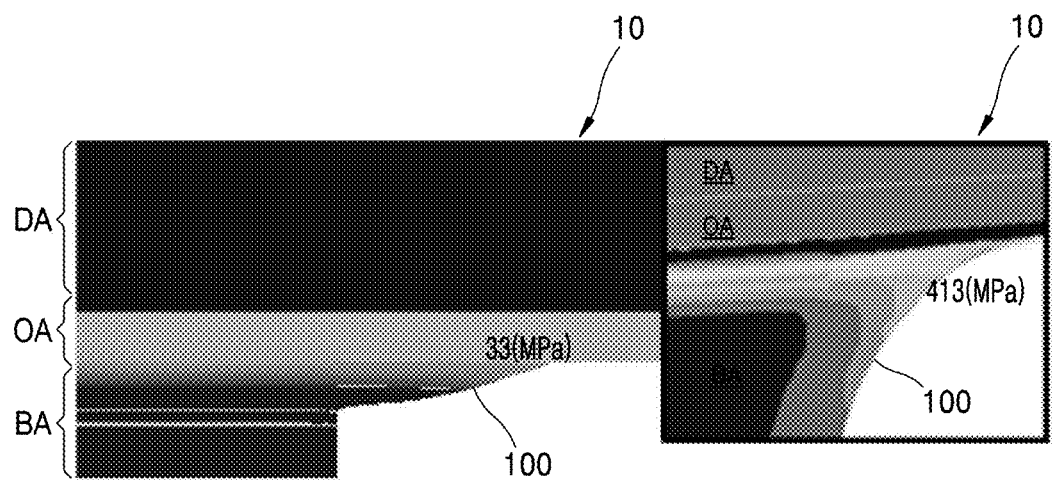
FIG. 6 is an image schematically illustrating distribution of internal stress generated in a bending area and an area adjacent to the bending area in a display panel according to an embodiment.

FIG. 5 is an image schematically illustrating distribution of internal stress generated in a bending area and an area adjacent to the bending area in a display panel 10' according to a comparative example, and FIG. 6 is an image schematically illustrating distribution of internal stress generated in a bending area and an area adjacent to the bending area in a display panel 10 according to an embodiment.

In the display panel 10' of the comparative example of FIG. 5, a side surface of a functional layer does not coincide with a side surface of a lower protective layer. For example, the side surface of the functional layer may be arranged closer to a display area than the side surface of the lower protective layer. On the other hand, in the display panel 10 of FIG. 6, as described above with reference to FIG. 3, the side surface (see FLa of FIG. 3) of the functional layer (see FL of FIG. 3) may coincide with the first side surface (see PL1a of FIG. 3) of the lower protective layer (see PL of FIG. 3).

Referring to FIG. 5, as a result of measuring the internal stress generated in the encapsulation layer and the substrate 100' of the display panel 10' of the comparative example after the display panel 10' of the comparative example is bent at an angle of 90 degrees in the bending area BA, the value of the maximum internal stress generated at the end portion of the encapsulation layer of the comparative example was about 1,163 MPa, and the value of the maximum internal stress generated in the substrate 100' of the comparative example was about 565 MPa.

Referring to FIG. 6, in the display panel 10 according to the embodiment, as a result of measuring the internal stress under the same conditions, the value of the maximum internal stress generated at the end portion of the encapsulation layer (see TFE of FIG. 3) of the display panel 10 was about 33 MPa, and the value of the maximum internal stress generated in the substrate 100 was about 413 MPa.

According to an embodiment, because the side surface FLa of the functional layer FL of the display panel 10 is arranged to coincide with the first side surface PL1a of the lower protective layer PL, the internal stresses of the encapsulation layer TFE and the substrate 100 may be greatly reduced in the bending area BA and the outer area OA adjacent to the bending area BA in the display panel 10. Therefore, cracking and damage to the encapsulation layer TFE and the substrate 100 of the display panel 10 may be minimized or prevented. Consequently, the display panel 10 having a reduced defect rate and increased reliability may be provided.

Figure 7:
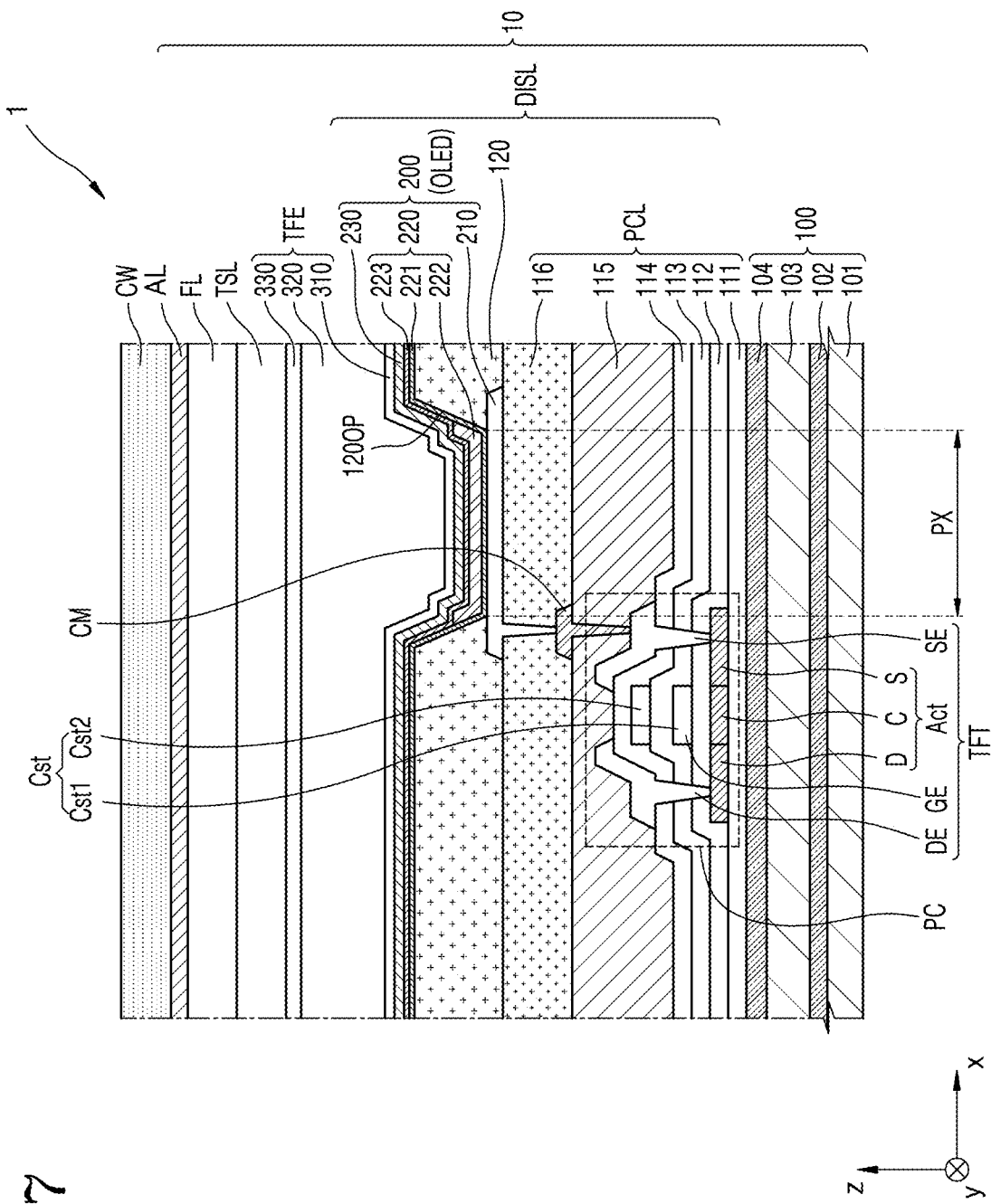
FIG. 7 is a cross-sectional view schematically illustrating a portion of a display apparatus, according to an embodiment.

FIG. 7 is a cross-sectional view schematically illustrating a portion of a display apparatus 1, according to an embodiment. For convenience of illustration, the components on the lower surface of the substrate 100 are omitted. The same reference numerals denote the same components as those described above with reference to FIGS. 3 and 4, and redundant descriptions thereof are omitted. Hereinafter, a stack structure of a substrate 100, a display layer DISL, and an encapsulation layer TFE in the display apparatus 1 will be described in detail with reference to FIG. 7.

Referring to FIG. 7, the display apparatus 1 may include a display panel 10 and a cover window CW on the display panel 10. The display panel 10 may include a substrate 100, a display layer DISL, an encapsulation layer TFE, a touch sensing layer TSL, and a functional layer FL. The display layer DISL may include a stack structure of a pixel circuit layer PCL, a pixel defining layer 120, and a light-emitting element 200.

The substrate 100 may have a multilayer structure including an inorganic layer and a base layer including a polymer resin. For example, the substrate 100 may include barrier layers of an inorganic insulating layer and a base layer including a polymer resin. For example, the substrate 100 may include a first base layer 101, a first barrier layer 102, a second base layer 103, and a second barrier layer 104, which are sequentially stacked. The first base layer 101 and the second base layer 103 may include polyimide (PI), polyethersulfone (PES), polyarylate, polyetherimide (PEI), polyethylene naphthalate (PEN), polyethylene terephthalate (PET), polyphenylene sulfide (PPS), polycarbonate (PC), cellulose triacetate (TAC), or/and cellulose acetate propionate (CAP). The first barrier layer 102 and the second barrier layer 104 may include an inorganic insulating material, such as silicon oxide, silicon oxynitride, and silicon nitride. The substrate 100 may be flexible.

The pixel circuit layer PCL may be arranged on the substrate 100. The pixel circuit layer PCL may include a pixel circuit PC including a thin-film transistor TFT and a storage capacitor Cst. Also, the pixel circuit layer PCL may include a buffer layer 111, a first gate insulating layer 112, a second gate insulating layer 113, an interlayer insulating layer 114, a first planarization insulating layer 115, and a second planarization insulating layer 116, which are below and/or above the components of the pixel circuit PC.

The buffer layer 111 may reduce or prevent infiltration of foreign material, moisture, or ambient air from below the substrate 100 and may provide a flat surface on the substrate 100. The buffer layer 111 may include an inorganic insulating material, such as silicon oxide, silicon oxynitride, or silicon nitride, and may have a single-layer structure or a multilayer structure including the above-described material.

The thin-film transistor TFT on the buffer layer 111 may include a semiconductor layer Act, and the semiconductor layer Act may include polysilicon. Alternatively, the semiconductor layer Act may include amorphous silicon, an oxide semiconductor, or an organic semiconductor. The semiconductor layer Act may include a channel region C, and a drain region D and a source region S on both sides of the channel region C. A gate electrode GE may overlap the channel region C.

The gate electrode GE may include a low resistance metal material. The gate electrode GE may include a conductive material including molybdenum (Mo), aluminum (Al), copper (Cu), titanium (Ti), and the like, and may include a single layer or multiple layers including the above-described material.

The first gate insulating layer 112 between the semiconductor layer Act and the gate electrode GE may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second gate insulating layer 113 may be arranged to cover the gate electrode GE. Similar to the first gate insulating layer 112, the second gate insulating layer 113 may include an inorganic insulating material such as silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

An upper electrode Cst2 of the storage capacitor Cst may be arranged on the second gate insulating layer 113. The upper electrode Cst2 may overlap the gate electrode GE therebelow. In this case, the gate electrode GE and the upper electrode Cst2 overlapping each other with the second gate insulating layer 113 therebetween may form the storage capacitor Cst. That is, the gate electrode GE may function as a lower electrode Cst1 of the storage capacitor Cst.

As such, the storage capacitor Cst and the thin-film transistor TFT may overlap each other. In some embodiments, the storage capacitor Cst may not overlap the thin-film transistor TFT.

The upper electrode Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or multiple layers including the above-described material.

The interlayer insulating layer 114 may cover the upper electrode Cst2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 114 may include a single layer or multiple layers including the above-described inorganic insulating material.

The drain electrode DE and the source electrode SE may be on the interlayer insulating layer 114. The drain electrode DE and the source electrode SE may be respectively connected to the drain region D and the source region S through contact holes of the insulating layers therebelow. The drain electrode DE and the source electrode SE may include a material having good conductivity. The drain electrode DE and the source electrode SE may include a conductive material including molybdenum (Mo), aluminum (Al), copper (Cu), titanium (Ti), and the like, and may include a single layer or multiple layers including the above-described material. In an embodiment, the drain electrode DE and the source electrode SE may have a multilayer structure of Ti/Al/Ti.

The first planarization insulating layer 115 may cover the drain electrode DE and the source electrode SE. The first planarization insulating layer 115 may include an organic insulating material, such as a general-purpose polymer (e.g., polymethylmethacrylate (PMMA) or polystyrene (PS)), a polymer derivative having a phenol-based group, an acrylic polymer, an imide-based polymer, an aryl ether-based polymer, an amide-based polymer, a fluorine-based polymer, a p-xylene-based polymer, a vinyl alcohol-based polymer, and a blend thereof.

The second planarization insulating layer 116 may be on the first planarization insulating layer 115. The second planarization insulating layer 116 may include the same material as that of the first planarization insulating layer 115, and may include an organic insulating material such as a general-purpose polymer (e.g., polymethylmethacrylate (PMMA) or polystyrene (PS)), a polymer derivative having a phenol-based group, an acrylic polymer, an imide-based polymer, an aryl ether-based polymer, an amide-based polymer, a fluorine-based polymer, a p-xylene-based polymer, a vinyl alcohol-based polymer, and a blend thereof.

The light-emitting element 200 may be on the pixel circuit layer PCL having the above-described structure. The light-emitting element 200 may include, for example, an organic light-emitting diode OLED. The organic light-emitting diode OLED may include a stack structure of a pixel electrode 210, an intermediate layer 220, and an opposite electrode 230. For example, the organic light-emitting diode OLED may emit red light, green light, or blue light, or may emit red light, green light, blue light, or white light. The organic light-emitting diode OLED may emit light through an emission area, and the emission area may be defined as a pixel PX.

The pixel electrode 210 may be electrically connected to the thin-film transistor TFT through contact holes formed in the second planarization insulating layer 116 and the first planarization insulating layer 115 and a contact metal CM arranged on the first planarization insulating layer 115.

The pixel electrode 210 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 210 may include a reflective layer including silver (Ag), magnesium (Mg), aluminum (Al), platinum (Pt), palladium (Pd), gold (Au), nickel (Ni), neodymium (Nd), Iridium (Ir), chromium (Cr), or any compound thereof. In another embodiment, the pixel electrode 210 may further include a layer including ITO, IZO, ZnO, or In2O3 above/below the reflective layer.

The pixel defining layer 120 having an opening 120OP exposing the central portion of the pixel electrode 210 is on the pixel electrode 210. The pixel defining layer 120 may include an organic insulating material and/or an inorganic insulating material. The opening 120OP may define an emission area of light emitted from the light-emitting element 200. For example, the size and width of the opening 120OP may correspond to the size and width of the emission area. Therefore, the size and/or width of the pixel PX may depend on the size and/or width of the opening 120OP of the corresponding pixel defining layer 120.

The intermediate layer 220 may include an emission layer 222 corresponding to the pixel electrode 210. The emission layer 222 may include a high molecular weight organic material or a low molecular weight organic material that emits light of a certain color. Alternatively, the emission layer 222 may include an inorganic emission material or may include quantum dots.

A first functional layer 221 and a second functional layer 223 may be below and above the emission layer 222, respectively. The first functional layer 221 may include, for example, a hole transport layer (HTL), or may include an HTL and a hole injection layer (HIL). The second functional layer 223 may be on the emission layer 222, and may include an electron transport layer (ETL) and/or an electron injection layer (EIL). Like the opposite electrode 230 to be described later, the first functional layer 221 and/or the second functional layer 223 may be a common layer covering the entire substrate 100.

The opposite electrode 230 may be arranged on the pixel electrode 210 and may overlap the pixel electrode 210. The opposite electrode 230 may include a conductive material having a low work function. For example, the opposite electrode 230 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the opposite electrode 230 may further include a layer such as ITO, IZO, ZnO, or $In_2O_3$ on the (semi)transparent layer including the is above-described material. The opposite electrode 230 may be integrally formed to completely cover the substrate 100.

The display panel 10 may include a plurality of light-emitting elements 200, and the light-emitting elements 200 may emit light through the pixels PX to provide an image. That is, the display area (see DA of FIG. 1) may be defined by the light-emitting elements 200.

The encapsulation layer TFE may be arranged on the opposite electrode 230 of the light-emitting element 200 and may cover the light-emitting elements 200 of the display layer DISL. The encapsulation layer TFE includes at least one inorganic encapsulation layer and at least one organic encapsulation layer. As an embodiment, FIG. 7 illustrates that the encapsulation layer TFE includes a first inorganic encapsulation layer 310, an organic encapsulation layer 320, and a second inorganic encapsulation layer 330, which are sequentially stacked.

The first inorganic encapsulation layer 310 and the second inorganic encapsulation layer 330 may include one or more inorganic materials selected from aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acrylic resin, an epoxy-based resin, polyimide, polyethylene, and the like. In an embodiment, the organic encapsulation layer 320 may include acrylate. The organic encapsulation layer 320 may be formed by curing a monomer or applying a polymer. The organic encapsulation layer 320 may be transparent.

The touch sensing layer TSL including sensing electrodes may be arranged on the encapsulation layer TFE, and the functional layer FL may be arranged on the touch sensing layer TSL. The cover window CW may be arranged on the functional layer FL, and the cover window CW may be attached to the functional layer FL through an adhesive layer AL including an adhesive member. Although not illustrated, an adhesive member may also be arranged between the touch sensing layer TSL and the functional layer FL.

Figure 8:
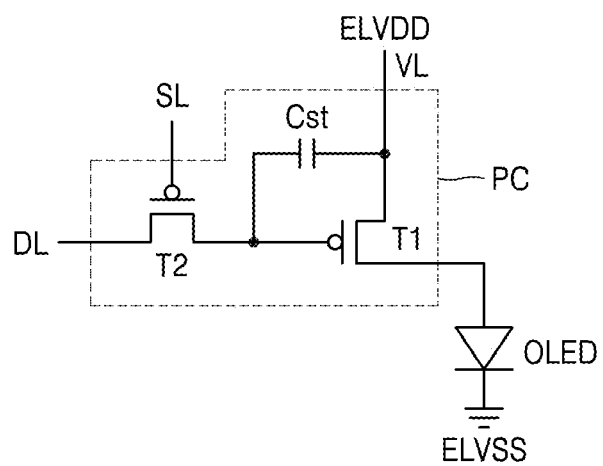
FIG. 8 is an equivalent circuit diagram of a pixel circuit included in a display apparatus, according to an embodiment.

FIG. 8 is an equivalent circuit diagram of a pixel circuit PC included in a display apparatus, according to an embodiment.

Referring to FIG. 8, the pixel circuit PC may include the thin-film transistors (see TFT of FIG. 7) and the storage capacitor (see Cst of FIG. 7), and may be electrically connected to an organic light-emitting diode OLED. In an embodiment, the pixel circuit PC may include a driving thin-film transistor T1, a switching thin-film transistor T2, and a storage capacitor Cst.

The switching thin-film transistor T2 may be connected to a scan line SL and a data line DL and may be configured to transmit a data voltage or a data voltage input from the data line DL to the driving thin-film transistor T1 based on a scan signal or a switching voltage input from the scan line SL. The storage capacitor Cst may be connected to the switching thin-film transistor T2 and a driving voltage line VL and may be configured to store a voltage corresponding to a difference between a voltage received from the switching thin-film transistor T2 and a first power supply voltage ELVDD supplied to the driving voltage line VL.

The driving thin-film transistor T1 may be connected to the driving voltage line VL and the storage capacitor Cst and may be configured to control a driving current flowing from the driving voltage line VL to the organic light-emitting diode OLED in response to a voltage value stored in the storage capacitor Cst. An opposite electrode (e.g., a cathode) of the organic light-emitting diode OLED may be configured to receive a second power supply voltage ELVSS. The organic light-emitting diode OLED may emit light having a certain luminance according to the driving current.

Although a case in which the pixel circuit PC includes two thin-film transistors and one storage capacitor has been described, the inventive concepts are not limited thereto. For example, the pixel circuit PC may include three or more thin-film transistors and/or two or more storage capacitors. In an embodiment, the pixel circuit PC may include seven thin-film transistors and one storage capacitor. The number of thin-film transistors and the number of storage capacitors may be variously changed according to the design of the pixel circuit PC. However, for convenience of description, a case in which the pixel circuit PC includes two thin-film transistors and one storage capacitor will be described.

Figure 9:
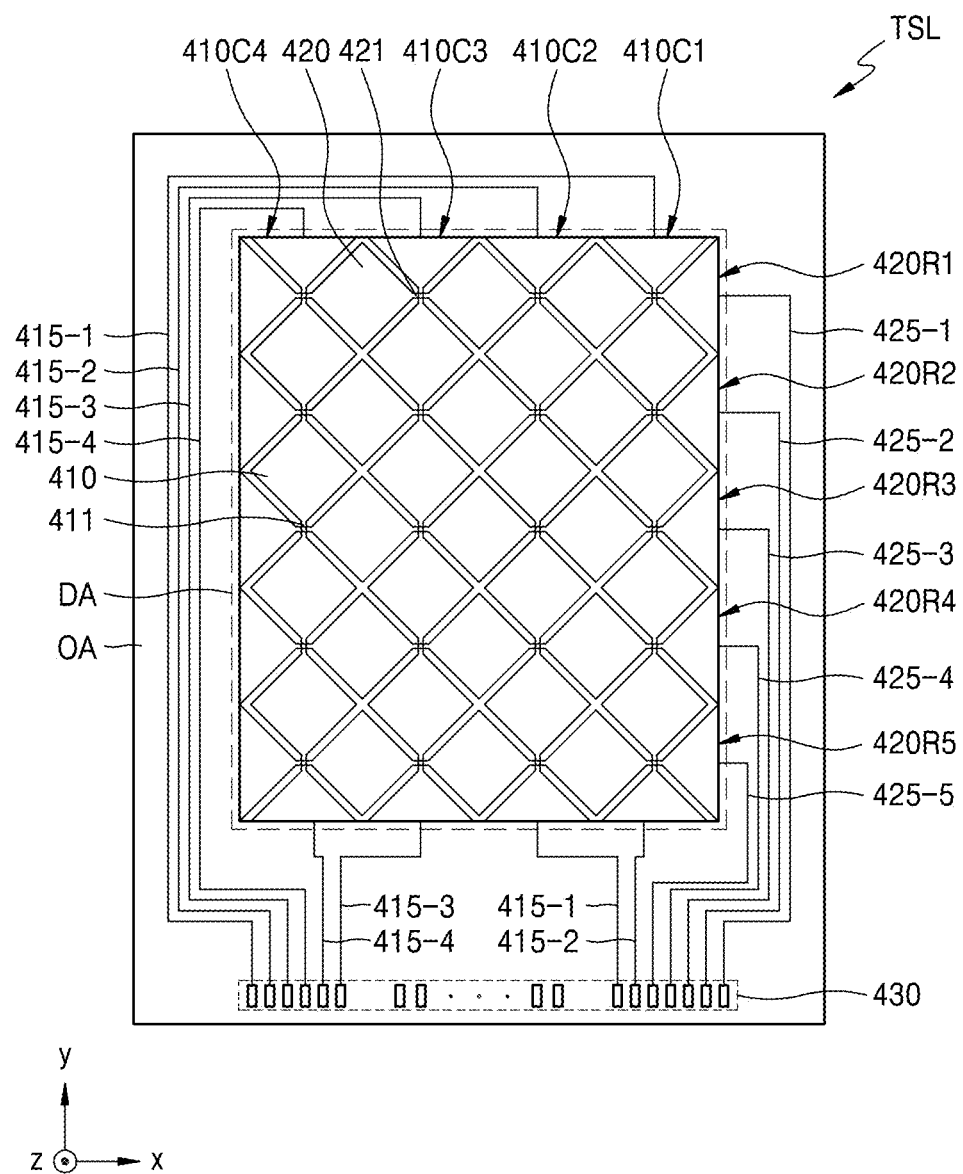
FIG. 9 is a plan view schematically illustrating a touch sensing layer of a display apparatus, according to an embodiment.

FIG. 9 is a plan view schematically illustrating a touch sensing layer TSL of a display apparatus, according to an embodiment.

Referring to FIG. 9, the touch sensing layer TSL may include first sensing electrodes 410, first trace lines 415-1 to 415-4 connected to the first sensing electrodes 410, second sensing electrodes 420, and second trace lines 425-1 to 425-5 connected to the second sensing electrodes 420. The first sensing electrodes 410 and the second sensing electrodes 420 may be arranged in a display area DA, and the first trace lines 415-1 to 415-4 and the second trace lines 425-1 to 425-5 may be arranged in an outer area OA.

The first sensing electrodes 410 may be arranged in the ±y direction, and the second sensing electrodes 420 may be arranged in the ±x direction crossing the ±y direction. The first sensing electrodes 410 arranged in the ±y direction may be connected to each other by a first connection electrode 411 between the first sensing electrodes 410 adjacent to each other to form first sensing lines 410C1 to 410C4, respectively. The second sensing electrodes 420 arranged in the ±x direction may be connected to each other by a second connection electrode 421 between the second sensing electrodes 420 adjacent to each other to form second sensing lines 420R1 to 420R5, respectively. The first sensing lines 410C1 to 410C4 and the second sensing lines 420R1 to 420R5 may cross each other. For example, the first sensing lines 410C1 to 410C4 and the second sensing lines 420R1 to 420R5 may perpendicularly cross each other.

The first sensing lines 410C1 to 410C4 may be connected to pads of a sensing signal pad part 430 through the first trace lines 415-1 to 415-4 formed in the outer area OA. For example, the first trace lines 415-1 to 415-4 may have a double routing structure. That is, the first trace lines 415-1 to 415-4 may be connected to the upper and lower sides of the first sensing lines 410C1 to 410C4, respectively. The first trace lines 415-1 to 415-4 respectively connected to the upper and lower sides of the first sensing lines 410C1 to 410C4 may be connected to the corresponding pads.

The second sensing lines 420R1 to 420R5 may be connected to the pads of the sensing signal pad part 430 through the second trace lines 425-1 to 425-5 formed in the outer area OA. For example, the second trace lines 425-1 to 425-5 may be connected to the corresponding pads.

FIG. 9 illustrates the double routing structure in which the first trace lines 415-1 to 415-4 are respectively connected to the upper and lower sides of the first sensing lines 410C1 to 410C4, and such a structure may improve sensing sensitivity (or touch sensitivity). However, the disclosure is not limited thereto. In another embodiment, the first trace lines 415-1 to 415-4 may have a single routing structure. That is, the first trace lines 415-1 to 415-4 may be respectively connected to the upper or lower side of the first sensing lines 410C1 to 410C4.

Figure 10:
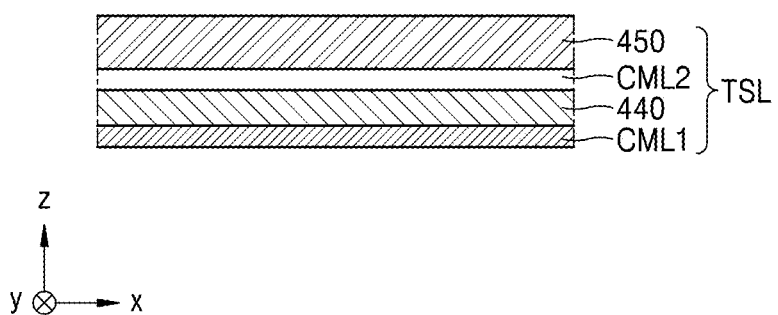
FIG. 10 is a cross-sectional view illustrating a stack structure of a touch sensing layer included in a display panel, according to an embodiment.

FIG. 10 is a cross-sectional view illustrating a stack structure of a touch sensing layer TSL included in a display panel, according to an embodiment.

Referring to FIG. 10, the touch sensing layer TSL may include a first conductive layer CML1 and a second conductive layer CML2. A first insulating layer 440 may be arranged between the first conductive layer CML1 and the second conductive layer CML2, and a second insulating layer 450 may be arranged on the second conductive layer CML2. Each of the first sensing electrodes (see 410 of FIG. 9), the first connection electrodes (see 411 of FIG. 9), the second sensing electrodes (see 420 of FIG. 9), and the second connection electrodes (see 421 of FIG. 9) may be included in the first conductive layer CML1 or the second conductive layer CML2.

The first and second conductive layers CML1 and CML2 may include a metal layer or a transparent conductive layer. The metal layer may include molybdenum (Mo), mendelevium (Mb), silver (Ag), titanium (Ti), copper (Cu), aluminum (Al), and any alloy thereof. The transparent conductive layer may include a transparent conductive oxide such as ITO, IZO, ZnO, and indium tin zinc oxide (ITZO). In addition, the transparent conductive layer may include a conductive polymer, such as poly(3,4-ethylenedioxythiophene) (PEDOT), metal nanowires, or graphene.

The first and second conductive layers CML1 and CML2 may include a single layer or multiple layers. The single-layered first and second conductive layers CML1 and CML2 may include a metal layer or a transparent conductive layer, and materials of the metal layer and the transparent conductive layer are the same as described above. One of the first and second conductive layers CML1 and CML2 may include a single metal layer. The single metal layer may include a molybdenum layer or an alloy layer of MoMd. The first conductive layer CML1 or the second conductive layer CML2 may include a multilayered metal layer. The multilayered metal layer may include, for example, three layers of a titanium layer/aluminum layer/titanium layer, or may include two layers of a molybdenum layer/mendelevium layer. Alternatively, the multilayered metal layer may include a metal layer and a transparent conductive layer. The first and second conductive layers CML1 and CML2 may have different stack structures or may have the same stack structure. For example, the first conductive layer CML1 may include a metal layer, and the second conductive layer CML2 may include a transparent conductive layer. Alternatively, the first and second conductive layers CML1 and CML2 may include the same metal layer.

Materials of the first and second conductive layers CML1 and CML2 and the arrangement of the sensing electrodes provided in the first and second conductive layers CML1 and CML2 may be determined considering sensing sensitivity. An RC delay may affect the sensing sensitivity. Because the sensing electrodes including the metal layer have a low resistance, compared with the transparent conductive layers, an RC value may be reduced. Therefore, the charging time of the capacitor defined between the sensing electrodes may be reduced. The sensing electrodes including the transparent conductive layers are not visible to a user, compared with the metal layers, and the input area may increase, thereby increasing the capacitance.

The first and second insulating layers 440 and 450 may include an inorganic insulating material or/and an organic insulating material. The inorganic insulating material may include silicon oxide, silicon nitride, or silicon oxynitride, and the organic insulating material may include a high molecular weight organic material.

Some of the first and second sensing electrodes 410 and 420 and the first and second connection electrodes 411 and 421 described above with reference to FIG. 9 may be located on the first conductive layer CML1, and the others thereof may be located on the second conductive layer CML2. In an embodiment, the first conductive layer CML1 may include the first connection electrodes 411, and the second conductive layer CML2 may include the first and second sensing electrodes 410 and 420 and the second connection electrodes 421. In another embodiment, the first conductive layer CML1 may include the first and second sensing electrodes 410 and 420 and the second connection electrodes 421, and the second conductive layer CML2 may include the first connection electrodes 411. In another embodiment, the first conductive layer CML1 may include the first sensing electrodes 410 and the first connection electrodes 411, and the second conductive layer CML2 may include the second sensing electrodes 420 and the second connection electrodes 421. In this case, the first sensing electrodes 410 and the first connection electrodes 411 are provided on the same layer and integrally connected to each other, and the second sensing electrodes 420 and the second connection electrodes 421 are also on the same layer. Therefore, no contact holes may be provided in the insulating layer between the first conductive layer CML1 and the second conductive layer CML2.

FIG. 10 illustrates that the touch sensing layer TSL includes the first conductive layer CML1, the first insulating layer 440, the second conductive layer CML2, and the second insulating layer 450, but in another embodiment, a layer including an inorganic insulating material or an organic insulating material may be further arranged under the first conductive layer CML1.

Figure 11A:
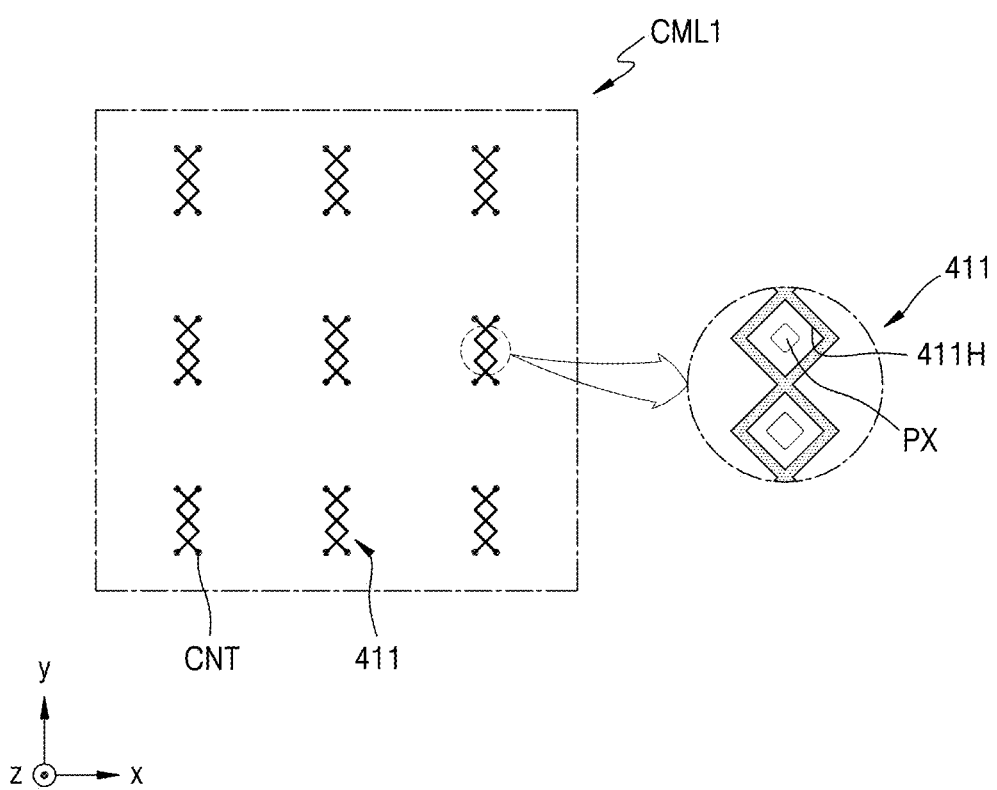
FIGS. 11A and 11B are plan views illustrating a first conductive layer and a second conductive layer in a touch sensing layer included in a display panel, according to an embodiment, respectively.
Figure 11B:
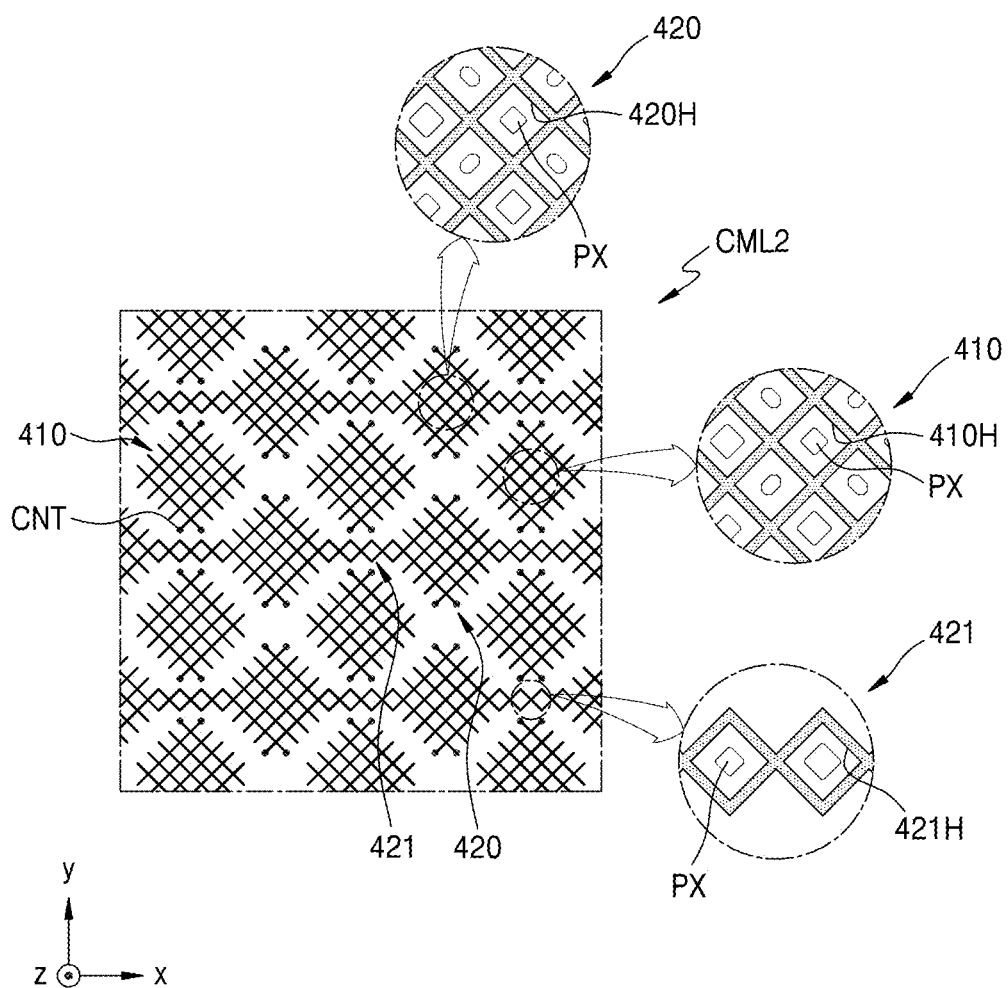

FIGS. 11A and 11B are plan views illustrating a first conductive layer and a second conductive layer in a touch sensing layer included in a display panel, according to an embodiment, respectively.

Referring to FIGS. 11A and 11B, the first and second sensing electrodes 410 and 420 and the first and second connection electrodes 411 and 421 may have a mesh (or grid) shape. When the first and second sensing electrodes 410 and 420 include a metal layer, the first and second sensing electrodes 410 and 420 may have a mesh shape, as illustrated in FIGS. 11A and 11B, so as to prevent the first and second sensing electrodes 410 and 420 from being visible to the user and/or transmitting light emitted from each pixel PX.

As illustrated in the enlarged views of FIGS. 11A and 11B, the first and second sensing electrodes 410 and 420 may include mesh-shaped metal layers including holes 410H and 420H, respectively. Similarly, the first and second connection electrodes 411 and 421 may also include mesh-shaped metal layers including holes 411H and 421H, respectively. The holes 410H, 420H, 411H, and 421H may be arranged to overlap the pixels PX.

As illustrated in FIG. 11A, the first conductive layer CML1 may include the first connection electrode 411. The first connection electrode 411 may electrically connect the first connection electrode 411 to the first sensing electrodes 410 formed on different layers from each other. The first connection electrode 411 electrically connecting the adjacent first sensing electrodes 410 to each other may be connected to the first sensing electrodes 410 through a contact hole CNT formed in the first insulating layer (see 43 of FIG. 6).

As illustrated in FIG. 11B, the second conductive layer CML2 may include the first sensing electrode 410, the second sensing electrode 420, and the second connection electrode 421. The second sensing electrodes 420 may be connected to each other by the second connection electrodes 421 formed on the same layer as the second sensing electrodes 420. For example, the second sensing electrodes 420 include the same material as that of the second connection electrodes 421 and may be integral with each other. The first sensing electrodes 410 may be electrically connected to each other by the first connection electrodes 411 formed on a different layer from the first sensing electrodes 410. The first sensing electrodes 410 may be connected to the first sensing electrodes 410 through the contact hole CNT formed in the first insulating layer 440.

Only the display panel and the display apparatus including the same have been mainly described, but the inventive concepts are not limited thereto. For example, it will be understood that a method of manufacturing the display panel and a method of manufacturing the display apparatus also fall within the scope of the disclosure.

According to one or more embodiments, the display panel and the display apparatus including the same may reduce the magnitude of internal stress in the bending area and the area adjacent to the bending area in the display panel and minimizing or preventing occurrence of cracks and damage. The scope of the disclosure is not limited by such an effect.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display panel comprising:
a substrate having a first area, a second area located at one side of the first area, and a third area located between the first area and the second area;
a display layer arranged in the first area on a first surface of the substrate, the display layer comprising a light-emitting element;
a functional layer disposed on the display layer;
a lower protective layer disposed on a second surface opposite the first surface of the substrate; and
a lower cover panel disposed on one surface of the lower protective layer,
wherein a side surface of the functional layer coincides with a side surface of the lower protective layer.

2. The display panel of claim 1, further comprising a bending protective layer arranged in the third area of the substrate.

3. The display panel of claim 2, wherein the bending protective layer is in contact with the side surface of the functional layer.

4. The display panel of claim 1, wherein the side surface of the functional layer is located closer to the third area than the side surface of the lower cover panel.

5. The display panel of claim 1, wherein the functional layer comprises a polarizing film.

6. The display panel of claim 1, wherein the functional layer comprises an organic insulating film.

7. The display panel of claim 1, further comprising an encapsulation layer disposed between the display layer and the functional layer and covering the light-emitting element of the display layer.

8. The display panel of claim 7, wherein the encapsulation layer comprises at least one inorganic encapsulation layer and at least one organic encapsulation layer.

9. The display panel of claim 7, further comprising a touch sensing layer disposed between the encapsulation layer and the functional layer, the touch sensing layer comprising sensing electrodes and trace lines electrically connected to the sensing electrodes.

10. A display apparatus comprising:
a display panel having a display area and a peripheral area surrounding the display area and including a bending area, at least a portion of which is bent; and
a cover window disposed on a front surface of the display panel,
wherein the display panel comprises:
a substrate;
a display layer disposed on a first surface of the substrate, the display layer comprising a light-emitting element;
a functional layer disposed on the display layer;
a lower protective layer disposed on a second surface opposite to the first surface of the substrate; and
a lower cover panel disposed under the lower protective layer, and
wherein a side surface of the functional layer and a side surface of the lower protective layer are on a same straight line in a cross-sectional view.

11. The display apparatus of claim 10, wherein the display panel further comprises a bending protective layer disposed on the first surface of the substrate and located in the bending area.

12. The display apparatus of claim 11, wherein the bending protective layer of the display panel is in contact with the side surface of the functional layer.

13. The display apparatus of claim 10, wherein the side surface of the functional layer of the display panel is located closer to the bending area than a side surface of the lower cover panel.

14. The display apparatus of claim 10, wherein the functional layer of the display panel comprises a polarizing film.

15. The display apparatus of claim 10, wherein the functional layer of the display panel comprises an organic insulating film.

16. The display apparatus of claim 10, wherein the display panel further comprises an encapsulation layer disposed between the display layer and the functional layer in the display area.

17. The display apparatus of claim 16, wherein the encapsulation layer of the display panel comprises a first inorganic encapsulation layer, a second inorganic encapsulation layer disposed on the first inorganic encapsulation layer, and an organic encapsulation layer disposed between the first inorganic encapsulation layer and the second inorganic encapsulation layer.

18. The display apparatus of claim 16, wherein the display panel further comprises a touch sensing layer disposed between the encapsulation layer and the functional layer, the touch sensing layer comprising sensing electrodes and trace lines electrically connected to the sensing electrodes.

\* \* \* \* \*